United States Patent
Coleman et al.

(10) Patent No.: US 7,012,453 B2
(45) Date of Patent: Mar. 14, 2006

(54) PHASE CONTINUOUS SYNTHESIZER WITH PHASE COASTING AND ASSOCIATED METHODS

(75) Inventors: John Roger Coleman, Palm Bay, FL (US); Travis Sean Mashburn, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 21 days.

(21) Appl. No.: 10/761,046

(22) Filed: Jan. 20, 2004

(65) Prior Publication Data

US 2005/0156634 A1   Jul. 21, 2005

(51) Int. Cl.
*H03B 19/00* (2006.01)

(52) U.S. Cl. .................................... 327/113; 708/271
(58) Field of Classification Search ................ 327/105, 327/113–116; 455/71, 76; 331/34, 96; 342/174, 342/201; 708/271, 272
See application file for complete search history.

(56) References Cited

U.S. PATENT DOCUMENTS

| | | | |
|---|---|---|---|
| 4,935,706 A | 6/1990 | Schenberg | 331/11 |
| 5,317,285 A * | 5/1994 | Chan | 331/16 |
| 5,508,661 A * | 4/1996 | Keane et al. | 331/37 |
| 5,708,436 A | 1/1998 | Loiz et al. | 342/25 |
| 5,878,335 A | 3/1999 | Kushner | 455/260 |
| 5,894,592 A | 4/1999 | Brueske et al. | 455/86 |
| 6,154,640 A * | 11/2000 | Itoh et al. | 455/76 |
| 6,315,726 B1 * | 11/2001 | Watanabe | 600/447 |
| 6,373,344 B1 * | 4/2002 | Mar | 331/96 |
| 6,906,560 B1 * | 6/2005 | Coleman et al. | 327/105 |

* cited by examiner

*Primary Examiner*—Dinh T. Le
(74) *Attorney, Agent, or Firm*—Allen, Dyer, Doppelt, Milbrath & Gilchrist, P.A.

(57) ABSTRACT

The phase continuous synthesizer and method generate a relatively wideband swept frequency signal with the use of a first generator for generating a first swept frequency signal, and a second generator successively switching between different frequency signals while creating undesired phase discontinuities during switching. A mixer is connected to the first and second generators for mixing the first swept frequency signal and the successively switched different frequency signals to produce the relatively wideband swept frequency signal, and a phase coasting unit is connected downstream of the mixer to reduce the undesired phase discontinuities created during switching in the relatively wideband swept frequency signal.

17 Claims, 4 Drawing Sheets

PHASE CONTINUOUS SYNTHESIZER WITH PHASE COASTING AND ASSOCIATED METHODS

FIELD OF THE INVENTION

The present invention relates to the field of communication systems, and is particularly directed to a digitally controlled phase continuous synthesizer for relatively high frequency chirp applications, such as synthetic aperture radar (SAR) and the like, in which the synthesizer includes continuous phase calibration.

BACKGROUND OF THE INVENTION

Synthetic aperture radar (SAR) systems, typically located on board an aircraft or satellite platform, provide SAR imagery of the radar return signals in both the range dimension and the cross-range or azimuth dimension. Range resolution is achieved in a well known manner by using either a high bandwidth fixed frequency transmit pulse or a frequency modulated (FM) transmit pulse. Resolution in the cross-range dimension is achieved by synthesizing a large antenna aperture using the motion of the radar platform. The key to SAR is the data processing of reflected return data. For an overview of SAR, reference is made to "An Introduction To Synthetic Aperture Radar" by W. M. Brown and L. J. Porcello, IEEE Spectrum (September, 1969), pages 52–62.

For optimal performance, the frequency content of relatively high frequency communication signal processing systems, such as those used for generating wideband chirps for SAR, should be as pure as possible, in particular, they should exhibit phase continuity or coherency through the entire output frequency range. Analog synthesizer-based systems, which offer a relatively wide tuning range, suffer from arbitrary phase steps when switching between local oscillators. A direct digital synthesizer (DDS), on the other hand, provides phase continuity with low noise when switching, but is capable of operation within a relatively narrow tuning range (e.g., 100 MHz).

One technique currently used to generate a wideband chirp involves multiplying up the output chirp of a DDS to realize the desired output frequency range of the system. Unfortunately, successive multiplications also multiply noise by the same factor. This problem is compounded because radiation requirements typically limit the choice of DDS to those having relatively low frequency rates, which means that even higher multiplication factors are required. Another conventional approach is to limit the frequency range (width) of the chirp and use receiver processing to resolve phase errors associated with the discontinuities.

One conventional approach is disclosed in U.S. Pat. No. 5,878,335 to Kushner which is directed to a low-power digital frequency synthesizer that combines direct digital frequency synthesis techniques with serrodyne frequency translation principles to produce a wideband frequency response with high spectral purity. A DDS is used to generate a high-resolution analog carrier signal from a low-speed digital clock signal. The carrier signal is phase modulated by a low-resolution signal generated from a high-speed digital clock signal. The modulation signal is a higher frequency signal than the carrier signal, and the phase modulation is accomplished by exact decoded gain elements.

SUMMARY OF THE INVENTION

In view of the foregoing background, it is therefore an object of the present invention to provide a phase continuous synthesizer and method in which the synthesizer includes phase coasting to reduce and/or eliminate undesired phase discontinuities in the output wideband swept frequency signal.

This and other objects, features, and advantages in accordance with the present invention are provided by an apparatus for generating a relatively wideband swept frequency signal including a first generator for generating a first swept frequency signal, and a second generator successively switching between different frequency signals while creating undesired phase discontinuities during switching. A mixer is connected to the first and second generators for mixing the first swept frequency signal and the successively switched different frequency signals to produce the relatively wideband swept frequency signal, and a phase coasting unit is connected downstream of the mixer to reduce the undesired phase discontinuities created during switching in the relatively wideband swept frequency signal.

The phase coasting unit is preferably a third-order phase locked loop (PLL) including a phase detector, a switch connected to the phase detector and controlled to open during a switching interval, a plurality of integrators downstream from the switch, and a voltage controlled oscillator downstream from the plurality of integrators. The second generator generates an offset frequency signal and successively combines the offset frequency signal with a reference frequency signal to produce the successively switched different frequency signals. The first generator comprises a first digital synthesizer to generate the first swept frequency signal.

The second generator may include a second digital synthesizer to generate the offset frequency signal, a plurality of frequency converters to successively combine the offset frequency signal with a reference frequency signal to produce the successively switched different frequency signals, and a controller for controlling the operation of the second digital synthesizer to maintain phase continuity between the successively switched different frequency signals.

Objects, features, and advantages in accordance with the present invention are also provided by a method for generating a relatively wideband swept frequency signal including generating a first swept frequency signal with a first generator, and successively switching between different frequency signals with a second generator while creating undesired phase discontinuities during switching. The first swept frequency signal is combined with the successively switched different frequency signals to produce the relatively wideband swept frequency signal, and the undesired phase discontinuities are reduced by coasting over the undesired phase discontinuities in the relatively wideband swept frequency signal.

Again, this coasting is provided by a phase coasting unit, preferably a third-order phase locked loop (PLL), including a phase detector, a switch connected to the phase detector and controlled to open during a switching interval, a plurality of integrators downstream from the switch, and a voltage controlled oscillator downstream from the plurality of integrators.

Successively switching between different frequency signals preferably includes generating an offset frequency signal and successively combining the offset frequency signal with a reference frequency signal to produce the respective different frequency signals. Successively switching between different frequency signals may include connecting a plurality of frequency converters to an output of a reference frequency signal generator and coupling an offset frequency signal to the plurality of frequency converters to successively combine the offset frequency signal with the reference frequency signal to produce the different frequency signals. The first generator may be a first digital synthesizer, and the second generator may be a second digital synthesizer generating the offset frequency signal.

DETAILED DESCRIPTION OF THE PREFERRED EMBODIMENTS

Figure 1:
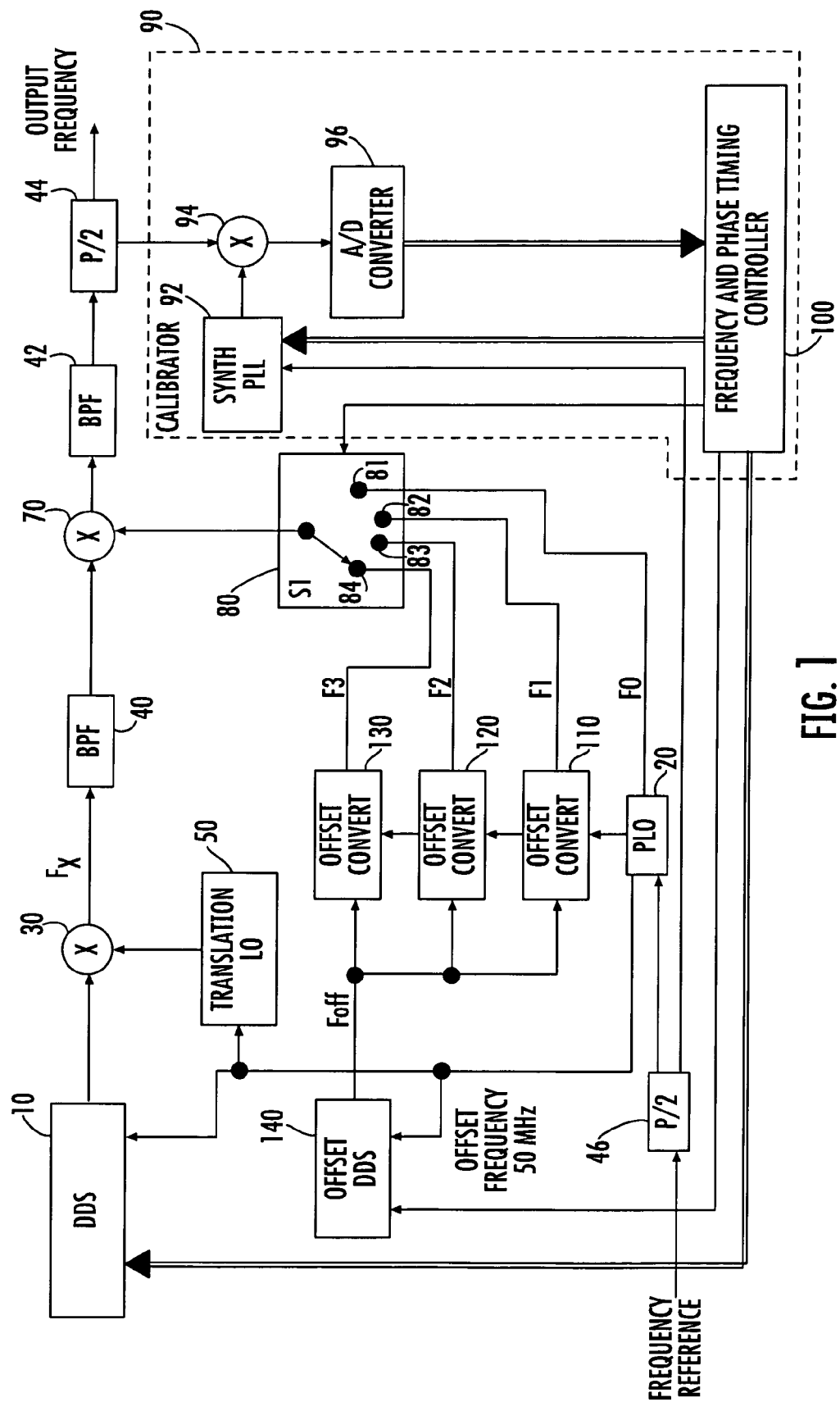
FIG. 1 is schematic block diagram of a phase continuous self-calibrating synthesizer according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Before describing in detail the phase-continuous frequency synthesizer of the present invention, it should be noted that the invention resides primarily in a modular arrangement of communication circuits and components and an associated controller therefor, that controls the operations of such circuits and components. In a practical implementation that facilitates their being packaged in a hardware-efficient equipment configuration, this modular arrangement may be implemented via an application specific integrated circuit (ASIC) chip set, for example.

Consequently, the architecture of the arrangement of circuits and components has been illustrated in the drawings by a readily understandable block diagram, which shows only those specific details that are pertinent to the present invention, so as not to obscure the disclosure with details which will be readily apparent to those skilled in the art having the benefit of the description herein. Thus, the block diagram illustration is primarily intended to show the major components of the invention in a convenient functional grouping, so that the present invention may be more readily understood.

Referring initially to FIG. 1, an embodiment of the phase-continuous frequency synthesizer of the present invention will now be described. The phase-continuous frequency synthesizer is diagrammatically illustrated as comprising a controlled 'fine' tune direct digital synthesizer (DDS) 10 that is operative, under the control of a controller 100, to produce a linearly swept or ramp frequency output. By 'fine' tune is meant that DDS 10 has the finest spectral granularity of various frequency tuning components of the system. As a non-limiting example, the frequency ramp produced by DDS 10 may be swept over a range from 100 to 200 MHz. Thus, in this example, the 'finest' tuning range within the system is 100 MHz.

The DDS 10 is coupled to a prescribed reference frequency (e.g., 100 MHz) produced by a phase locked oscillator (PLO) 20, which is coupled to receive a frequency reference from an external source (not shown). This reference frequency is used to synchronize the various components of the synthesizer, and may be provided to the PLO 20 via a power divider 46.

The fine tune DDS 10 is coupled to a mixer 30. Frequency translation oscillator 50 is operative to produce a relatively high radio frequency (RF) output, e.g., an RF frequency on the order of 1.0 GHz. The output of mixer 30 is coupled to a first band pass filter 40 which is then coupled to a frequency mixer 70, which is also coupled to the output of a switch (S1) 80. Switch 80 is operative under processor control, via controller 100, to switch among a plurality of coarse frequency inputs (four in the illustrated example at 81, 82, 83 and 84), that are used to define a coarse range of operation of the synthesizer (the fine tuning range of which is established by DDS 10, as described above).

For this purpose, the respective inputs 81, 82, 83 and 84 of switch 80 are coupled to PLO 20 and to a set of cascaded frequency offset converters 110, 120 and 130. Each frequency offset converter produces an output frequency that is equal to the sum of its input frequencies and under the phase control of the offset frequency DDS 140. PLO 20 generates a base coarse frequency F0, while the frequency offset converters 110, 120 and 130 produce respective coarse frequencies F1, F2 and F3, that are combinations of the base frequency F0 and an a coarse offset frequency Foff generated by an offset DDS 140. Offset DDS 140 is operative under the control of the controller 100 to produce the coarse offset frequency Foff equal to the sweep range of fine tune DDS 10, which, in the present example, may be 50 MHz, as described above.

The output frequency F1 produced by frequency offset converter 110 is equal to the sum of the offset frequency Foff supplied by DDS 140 and the base frequency F0 supplied by PLO 20; the output frequency F2 produced by offset converter 120 is equal to the sum of the offset frequency Foff and the frequency F1 supplied by offset converter 110; and the output frequency F3 produced by offset converter 130 is equal to the sum of the offset frequency Foff and the frequency F2 supplied by offset converter 120. Under the control of controller 100, the phase of the offset frequency Foff produced by offset DDS 140 is controllably adjustable, so as to provide for phase-continuity at the instances of switching among the respective input frequencies to switch 80. In particular, controller 100 sets the phase of the offset frequency Foff produced by offset DDS 140 to be equal to the negative of the measured phase error (discussed below), so that at the instant of switching between any of its inputs the new frequency to which switch 80 switches will be at zero degrees and phase continuous with the frequency from which switch 80 has switched. Of course, more than one switch 80 may be provided in combination with an associated multiplier and mixer to increase the sweep range of the chirp, as would be appreciated by the skilled artisan.

Mixer 70 provides the output chirp or swept frequency signal to another band pass filter 42 and a power divider 44.

The chirp is then typically provided to an up converter, transmitter and antenna as would be appreciated by the skilled artisan. However, undesired phase discontinuities in the chirp would normally occur during switching as will be described below.

Operation of the frequency synthesizer of FIG. 1 will now be described. For purposes of the present example, the offset frequency Foff is 50 MHz, as referenced above. Initially, at time t0 the phase of the offset frequency Foff produced by offset DDS 140 is controllably pre-set at zero phase. Also, switch 80 is coupled to receive the frequency F0 from PLO 20. As pointed out above, controller 100 sets the phase of the offset frequency Foff produced by offset DDS 140 to be equal to the negative value of overall phase error, so that at the instant of switching between any of their inputs the new frequencies to which switches 80 transition will be at zero degrees and phase continuous with the previous frequency. (It is to be understood that by "phase" is meant the relative difference between the pre-switched frequency and the post-switched frequency at the instant of switching, i.e., zero degrees difference and phase continuous.)

Whenever a transition is made to a new coarse frequency, the fine tune DDS 10 is reset to the beginning of its sweep and thereupon proceeds to ramp over its sweep range (100 MHz in the present example). Upon DDS 10 reaching the upper end of its sweep range, switch 80 switches to the next offset frequency F1 following F0 and the sweep of DDS 10 is restarted. The switch 80 sequentially transitions through its coarse frequency inputs 81-82-83-84. Therefore, referring to the timing diagram of FIG. 2, at time t0, the output of the synthesizer is equal to the product of the frequency output Fx of the mixer 30 plus the lowest coarse frequency F0. Between time t0 and time t1, as the frequency output of the fine tune DDS 10 ramps over its 100 Mhz range, the output of the synthesizer is linearly swept from Fx+F0 to Fx+ F0+Foff which equals Fx+F1. Upon reaching the frequency Fx+F0+Foff at time t1, fine tune DDS 10 returns to the base translation frequency Fx. However, since switch 80 is switched from input 81 to input 82, the output of the synthesizer begins sweeping from Fx+F1 to Fx+F1+Foff, and so on as the switch 80 is stepped through its additional inputs 83 and 84.

Figure 3A:
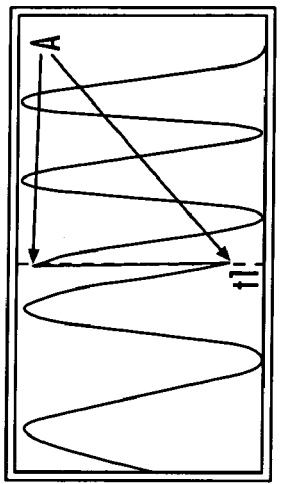
FIGS. 3A and 3B are enlarged views of a portion of the timing diagram of FIG. 2 illustrating detail of the phase continuous swept frequency signal at a switching point.
Figure 2:
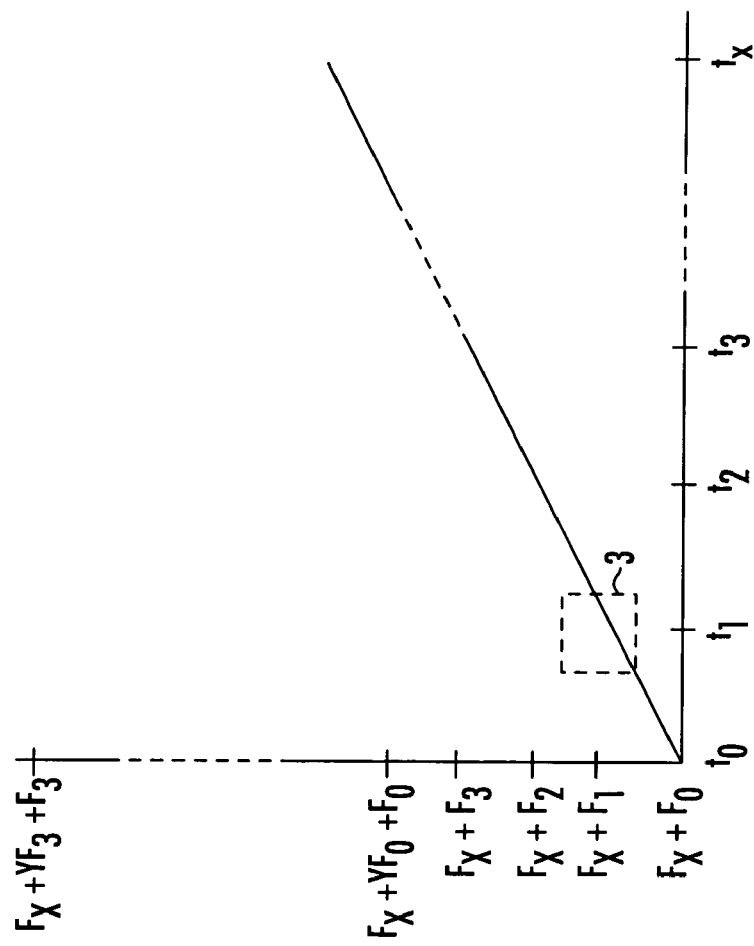
FIG. 2 is a timing diagram of the phase continuous swept frequency signal output from the synthesizer of FIG. 1.

Referring to FIG. 3A, the enlarged portion 3 of the timing diagram of FIG. 2 will be described. As discussed above, during the switching transients, e.g. at time t1, undesired phase discontinuities A would normally be created. Because phase continuity at the switching transients is needed to reduce SAR image degradation, such a synthesizer would typically require pre-mission calibration including precise phase measurements made on ground. Such measurements are intended to match the phase of the chirp across PLO 20 switching interval. This calibration and measurements would increase pre-mission set up time and may become a drift term over time and temperature after calibration.

Figure 3B:
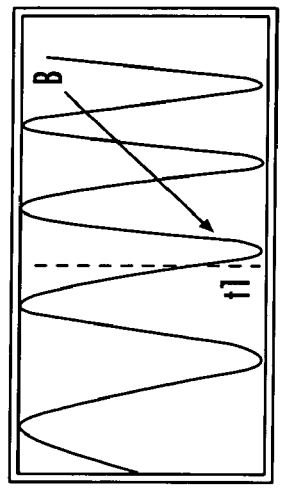

In the present invention, the phase continuous synthesizer includes a calibrator 90 to reduce the undesired phase discontinuities created during switching. Calibrating includes comparing the phase of the relatively wideband swept frequency signal output at the power divider 44 before and after successively switching between different frequency signals to determine the undesired phase discontinuities created during switching, and adjusting the phase of the offset frequency signal Foff generated by the offset DDS 140 to reduce the undesired phase discontinuities created during switching. The calibration includes a self-calibration feedback loop defined by a phase locked loop (PLL) 92 receiving the reference frequency signal, a mixer 94 receiving the chirp or swept frequency signal output at the power divider 44 and a phase reference signal from the PLL 92, an analog-to-digital (a/d) converter 96 receiving an output signal of the mixer, and the controller 100 which is connected to the a/d converter and provides a calibration signal to the offset DDS 140. Referring to FIG. 3B, the phase discontinuity B created during switching is reduced or eliminated at time t1 in the next chirp.

The PLL 92 is an auxiliary synthesizer added as a phase reference and is tuned to the frequency of the chirp at each switch point of the switch 80. The phase of the chirp is compared with the PLL 92 before and after switching to determine the change in phase due to switching. In other words, the instantaneous phase difference between chirp and PLL 92 is measured before and after switching. Settling time is not a challenge because the PLL 92 is set to frequency well in advance of the calibration need. The result is correlated in the controller 100 against a mathematical chirp waveform and the error is returned as feedback to adjust the phase of the offset DDS 140. Thus, the next chirp will reduce the phase difference during switching. The controller 100 determines the phase change needed, provides for averaging and resolves any 0°/180° ambiguity. Multiple settings may be provided in an adaptable lookup table to provide calibration at each switch point.

A plurality of approaches would be appropriate for determining the phase error. For example, a correlation method to maximize the cross-correlation between the desired and measured phase. Such a cross-correlation would be calculated between ideal and measured or between mirror-image of pre-switched and post-switched waveforms. Another approach may be to calculate the standard deviation on the phase difference between before and after switching. Also, in yet another approach, the arcsine could be taken of mirrored pre-switch and non-mirrored post switch waveforms while linear and quadratic time is removed from the phase function. In these various approaches, linearization may be needed.

In sum, the fine tune DDS 10 produces a chirp but does not fully cover the required output sweep range. Switch 80 selects offset to put the chirp within the output sweep range. At switch points, DDS 10 is at highest frequency and is switched to lowest frequency as the coarse step is made with the switch 80. The phase transient normally produced is adjusted out by changing the phase of the offset DDS 140 during the switching interval.

Previous embodiments utilized short duration RF switches to minimize the switching interval and reduce corresponding phase disturbances. However, such switches may not be readily available, and typically do not have good isolation from the switching signal to output. Phase continuity on either side of a switching transient is provided by phase calibration of the offset DDS 140, but switching is not instantaneous. Break-before-make switches have reduced output during switching and transients caused by varying return loss. Make-before-break switches have increased output and reflection induced phase disturbances during switching. So the output of the synthesizer has continuous phase except during the switching interval where the transient distorts the phase.

Figure 4:
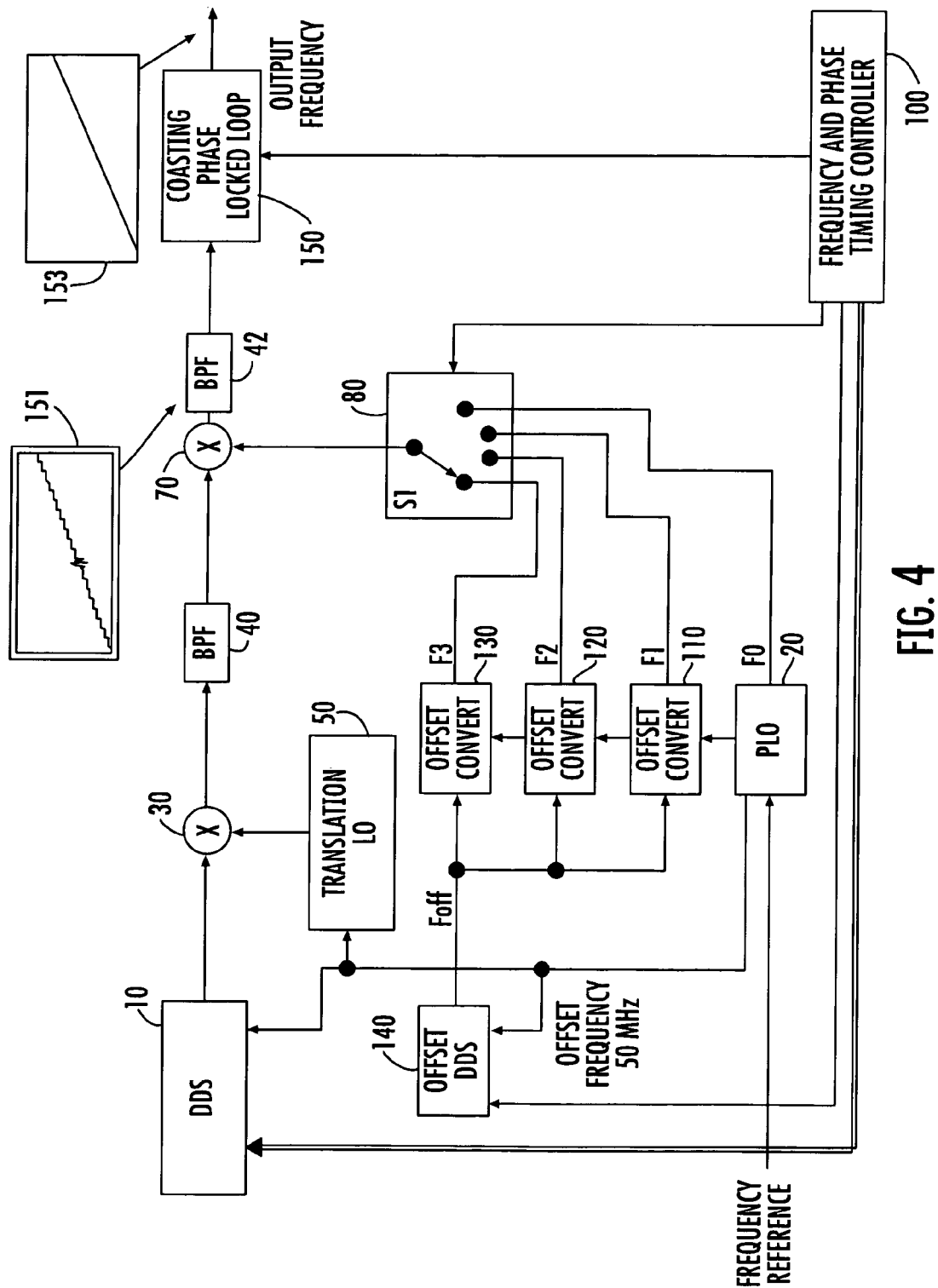
FIG. 4 is schematic block diagram of a phase continuous synthesizer including phase coasting according to another embodiment of the present invention.
Figure 5:
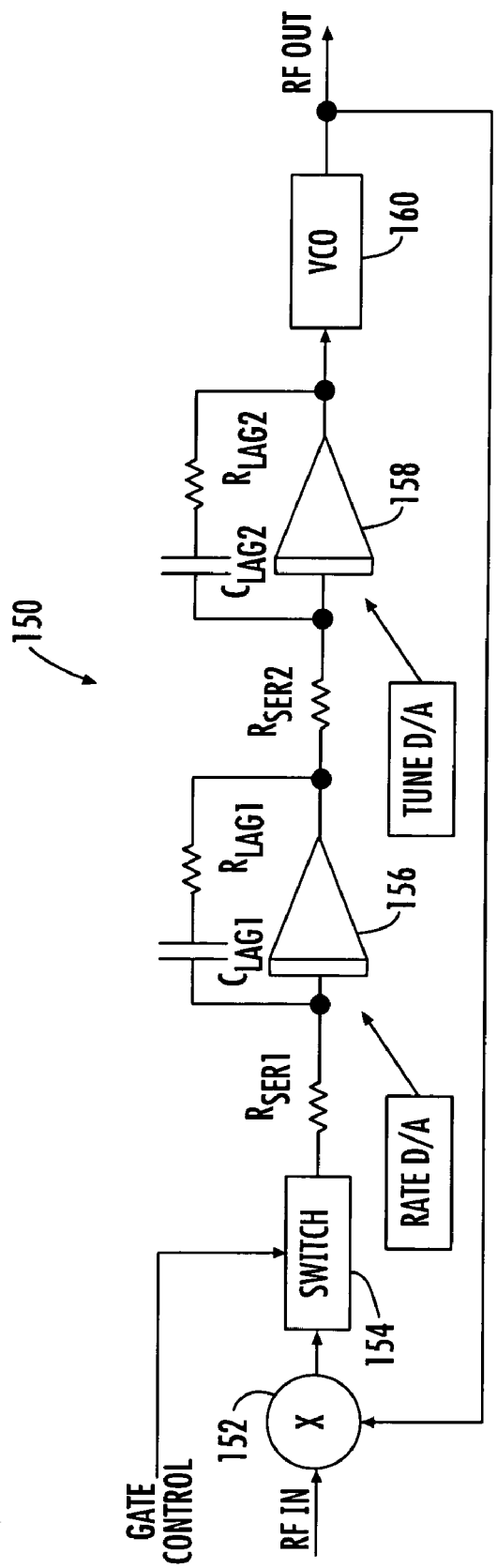
FIG. 5 is a more detailed schematic block diagram of the phase coasting unit of the phase continuous synthesizer of FIG. 4.

Referring to FIGS. 4 and 5, another embodiment of the phase continuous synthesizer will be described. In the simplified diagram, the calibrator 90 of the previous embodiment is not illustrated but may certainly be included in the present embodiment. Here, a phase coasting unit 150 is connected downstream of the mixer 70 and band pass filter 42 to reduce the undesired phase discontinuities created during switching in the output frequency signal. In other words, the phase coasting unit will track the phase of the output frequency signal and coast over the region of phase/ amplitude disturbance. The phase coasting unit 150 is preferably a high gain second or third-order phase locked loop (PLL) so there is little or no static phase error during frequency ramp. As an example of a third-order loop, the phase coasting unit 150 includes a phase detector 152, a switch 154 connected to the phase detector and controlled to open during a switching interval, a plurality of integrators 156, 158 downstream from the switch, and a voltage controlled oscillator 160 downstream from the plurality of integrators.

The analog switch 154 opens during the switching interval and holds the integrators 156, 158 constant. The VCO 160 continues to ramp since the conditions are the same as if ramp were present during switching. Also, the controller 100 may pretune the phase coasting loop 150 to set initial conditions at the beginning of the chirp for fast acquisition. The output of the phase coasting unit 150 is a ramp of frequency due to the integrators 156, 158 having fixed or zero voltage at their inputs. The blocks 151 and 153 schematically illustrate the swept frequency signal before and after phase coasting respectively.

The phase continuous self-calibrating synthesizer and method of the present invention can increase the performance of SAR. The invention improves the ability to widen the chirp range and allows higher radiation tolerant technologies to be used without sweep range degradation. The present invention also allows the use of frequency division to reduce spurious frequencies rather than the conventional approach of multiplication. The coasting loop provides a near-ideal chirp that is continuous without transients. Also, the typical stairstep frequency ramp from the DDS is smoothed out and appears as infinite granularity.

Other features of the phase continuous synthesizer may be described in greater detail in copending applications Ser. Nos. 10/760,990 to the Assignee entitled "PHASE-CONTINUOUS FREQUENCY SYNTHESIZER" and 10/761, 014 "SELF-CALIBRATING WIDEBAND PHASE CONTINUOUS SYNTHESIZER AND ASSOCIATED METHODS" and filed concurrently herewith, the entire disclosures of each of which are incorporated by reference herein in their entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An apparatus for generating a relatively wideband swept frequency signal comprising:
    a first generator for generating a first swept frequency signal;
    a second generator successively switching between different frequency signals while creating undesired phase discontinuities during switching;
    a mixer connected to said first and second generators for mixing the first swept frequency signal and the successively switched different frequency signals to produce the relatively wideband swept frequency signal; and
    a phase coasting unit connected downstream of the mixer to reduce the undesired phase discontinuities created during switching in the relatively wideband swept frequency signal.

2. The apparatus according to claim 1 wherein said phase coasting unit comprises a third-order phase locked loop (PLL).

3. The apparatus method according to claim 2, wherein said third-order PLL comprises:
    a phase detector;
    a switch connected to the phase detector and controlled to open during a switching interval;
    a plurality of integrators downstream from the switch; and
    voltage controlled oscillator downstream from the plurality of integrators.

4. The apparatus according to claim 1, wherein said first generator comprises a first digital synthesizer to generate the first swept frequency signal; and wherein said second generator comprises:
    a second digital synthesizer to generate an offset frequency signal;
    a plurality of frequency converters to successively combine the offset frequency signal with a reference frequency signal to produce the successively switched different frequency signals; and
    a controller for controlling the operation of said second digital synthesizer to maintain phase continuity between the successively switched different frequency signals.

5. The apparatus according to claim 1, wherein said second generator comprises:
    a plurality of frequency converters receiving a reference frequency signal; and
    a second digital synthesizer providing an offset frequency signal to the plurality of frequency converters to successively combine the offset frequency signal with the reference frequency signal to produce the different frequency signals.

6. An apparatus for generating a relatively wideband swept frequency signal comprising:
    a first digital synthesizer for generating a first swept frequency signal;
    a second generator successively switching between different frequency signals while creating undesired phase discontinuities during switching;
    a mixer connected to said first and second digital synthesizers for mixing the first swept frequency signal and the successively switched different frequency signals to produce the relatively wideband swept frequency signal; and
    a third-order phase locked loop (PLL) defining a phase coasting unit and connected downstream of the mixer to reduce the undesired phase discontinuities created during switching in the relatively wideband swept frequency signal.

7. The apparatus method according to claim 6, wherein said third-order PLL comprises:
    a phase detector;
    a switch connected to the phase detector and controlled to open during a switching interval;
    a plurality of integrators downstream from the switch; and
    voltage controlled oscillator downstream from the plurality of integrators.

8. The apparatus according to claim 6, wherein said second generator comprises:
    a second digital synthesizer to generate the offset frequency signal; and a plurality of frequency converters to successively combine the offset frequency signal with a reference frequency signal to produce the successively switched different frequency signals.

9. A method for generating a relatively wideband swept frequency signal comprising:
  generating a first swept frequency signal with a first generator;
  successively switching between different frequency signals with a second generator while creating undesired phase discontinuities during switching;
  combining the first swept frequency signal and the successively switched different frequency signals to produce the relatively wideband swept frequency signal; and
  reducing the undesired phase discontinuities in the relatively wideband swept frequency signal created during switching by coasting over the undesired phase discontinuities in the relatively wideband swept frequency signal.

10. The method according to claim 9, wherein coasting over the undesired phase discontinuities comprises providing a phase coasting unit defined by a third-order phase locked loop (PLL).

11. The method according to claim 10, wherein the third-order PLL comprises:
  a phase detector;
  a switch connected to the phase detector and controlled to open during a switching interval;
  a plurality of integrators downstream from the switch; and
  voltage controlled oscillator downstream from the plurality of integrators.

12. The method according to claim 9, wherein the first generator comprises a first digital synthesizer; and wherein the second generator comprises a second digital synthesizer generating an offset frequency signal and successively combining the offset frequency signal with a reference frequency signal to produce the respective different frequency signals.

13. The method according to claim 9, wherein successively switching between different frequency signals comprises:
  connecting a plurality of frequency converters to an output of a reference frequency signal generator; and
  coupling an offset frequency signal to the plurality of frequency converters to successively combine the offset frequency signal with the reference frequency signal to produce the different frequency signals.

14. A method for generating a relatively wideband swept frequency signal comprising:
  generating a first swept frequency signal with a first digital synthesizer;
  successively switching between different frequency signals with a second generator while creating undesired phase discontinuities during switching, the second generator comprising a second digital synthesizer generating an offset frequency signal arid a plurality of frequency converters receiving an output of a reference frequency signal generator and combining the offset frequency signal with the reference frequency signal to produce the respective different frequency signals;
  combining the first swept frequency signal and the successively switched different frequency signals to produce the relatively wideband swept frequency signal; and reducing the undesired phase discontinuities in the relatively wideband swept frequency signal created during switching by providing a phase coasting unit to coast over the undesired phase discontinuities in the relatively wideband swept frequency signal.

15. The method according to claim 14, wherein the phase coasting unit comprises a third-order phase locked loop (PLL).

16. The method according to claim 15, wherein the third-order PLL comprises:
  a phase detector;
  a switch connected to the phase detector and controlled to open during a switching interval;
  a plurality of integrators downstream from the switch; and
  voltage controlled oscillator downstream from the plurality of integrators.

17. The method according to claim 15, wherein the second generator further comprises a switch connected to the plurality of frequency converters to produce the respective different frequency signals.

* * * * *

UNITED STATES PATENT AND TRADEMARK OFFICE
CERTIFICATE OF CORRECTION

PATENT NO. : 7,012,453 B2
APPLICATION NO. : 10/761046
DATED : March 14, 2006
INVENTOR(S) : Coleman et al.

It is certified that error appears in the above-identified patent and that said Letters Patent is hereby corrected as shown below:

Column 3, Line 13    Delete: "is schematic"
                     Insert: --is a schematic--

Column 3, Line 21    Delete: "is schematic"
                     Insert: --is a schematic--

Column 4, Line 37    Delete: "an"

Column 10, Line 13   Delete: "arid"
                     Insert: --and--

Signed and Sealed this

Twenty-ninth Day of August, 2006

JON W. DUDAS
*Director of the United States Patent and Trademark Office*